United States Patent
Hyun et al.

(10) Patent No.: US 7,910,421 B2
(45) Date of Patent: Mar. 22, 2011

(54) METHODS OF FORMING DEVICES INCLUDING DIFFERENT GATE INSULATING LAYERS ON PMOS/NMOS REGIONS

(75) Inventors: Sang-jin Hyun, Gyeonggi-do (KR); Si-young Choi, Gyeonggi-do (KR); In-sang Jeom, Seoul (KR); Gab-jin Nam, Seoul (KR); Sang-bom Kang, Seoul (KR); Sug-hun Hong, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 91 days.

(21) Appl. No.: 12/130,646

(22) Filed: May 30, 2008

(65) Prior Publication Data

US 2008/0305620 A1 Dec. 11, 2008

(30) Foreign Application Priority Data

Jun. 8, 2007 (KR) .................. 10-2007-0056045

(51) Int. Cl.
*H01L 29/66* (2006.01)
(52) U.S. Cl. ............... 438/199; 438/275; 257/E21.637; 257/E21.639; 257/E21.625
(58) Field of Classification Search .................. 438/199, 438/275; 257/E21.637, E21.639, E21.625
See application file for complete search history.

(56) References Cited

U.S. PATENT DOCUMENTS

| | | | | |
|---|---|---|---|---|
| 5,480,828 A | * | 1/1996 | Hsu et al. | 438/275 |
| 5,498,555 A | * | 3/1996 | Lin | 438/302 |
| 6,091,109 A | * | 7/2000 | Hasegawa | 257/339 |
| 6,093,607 A | * | 7/2000 | Hsieh et al. | 438/266 |
| 6,333,244 B1 | | 12/2001 | Yu | |
| 6,713,358 B1 | | 3/2004 | Chau et al. | |
| 7,115,959 B2 | | 10/2006 | Andreoni et al. | |
| 7,737,009 B2 | * | 6/2010 | Lindsay et al. | 438/510 |
| 2001/0052618 A1 | * | 12/2001 | Hasegawa | 257/345 |
| 2003/0141560 A1 | | 7/2003 | Sun | |
| 2004/0021179 A1 | | 2/2004 | Lee et al. | |
| 2004/0099916 A1 | | 5/2004 | Rontondaro et al. | |
| 2004/0227186 A1 | | 11/2004 | Saito et al. | |

(Continued)

FOREIGN PATENT DOCUMENTS

JP 2004-349627 12/2004

(Continued)

OTHER PUBLICATIONS

Korean Notice of Office Action and English Translation (5 pages) corresponding to Korean Patent Application No. 10-2005-0072422; Mailing Date: Nov. 9, 2006.

(Continued)

*Primary Examiner* — Evan Pert
*Assistant Examiner* — Matthew Reames
(74) *Attorney, Agent, or Firm* — Myers Bigel Sibley & Sajovec, P.A.

(57) ABSTRACT

Provided is a method of manufacturing a semiconductor device, in which the thickness of a gate insulating layer of a CMOS device can be controlled. The method can include selectively injecting fluorine (F) into a first region on a substrate and avoiding injecting the fluorine (F) into a second region on the substrate. A first gate insulating layer is formed of oxynitride layers on the first and second regions to have first and second thicknesses, respectively, where the first thickness is less than the second thickness. A second gate insulating layer is formed on the first gate insulating layer and a gate electrode pattern is formed on the second gate insulating layer.

20 Claims, 5 Drawing Sheets

U.S. PATENT DOCUMENTS

| | | |
|---|---|---|
| 2005/0026345 A1 | 2/2005 | Adetutu et al. |
| 2005/0098839 A1 | 5/2005 | Lee et al. |
| 2005/0230743 A1 | 10/2005 | Nakagawa et al. |
| 2005/0250279 A1 | 11/2005 | Son et al. |
| 2005/0269635 A1 | 12/2005 | Bojarczuk et al. |
| 2005/0269651 A1 | 12/2005 | Chen et al. |
| 2006/0030096 A1 | 2/2006 | Weimer |
| 2006/0138603 A1 | 6/2006 | Cabral et al. |
| 2007/0032008 A1 | 2/2007 | Kim et al. |
| 2008/0305620 A1 | 12/2008 | Hyun et al. |

FOREIGN PATENT DOCUMENTS

| | | |
|---|---|---|
| JP | 2006-066923 | 3/2006 |
| KR | 1020000050587 A | 8/2000 |
| KR | 10-2003-0049352 A | 6/2003 |
| KR | 10-2003-0050179 A | 6/2003 |
| KR | 10-2003-0050678 A | 6/2003 |
| KR | 10-2003-0090411 A | 11/2003 |
| KR | 1020040011255 A | 2/2004 |
| KR | 10-2005-0034010 A | 4/2005 |
| KR | 10-2006-0077091 A | 7/2006 |

OTHER PUBLICATIONS

Korean First Office Action (4 pages) corresponding to Korean Patent Application No. 10-2007-0056045; Dated: Nov. 19, 2008.

* cited by examiner

METHODS OF FORMING DEVICES INCLUDING DIFFERENT GATE INSULATING LAYERS ON PMOS/NMOS REGIONS

CROSS-REFERENCE TO RELATED PATENT APPLICATION

This application claims the benefit of Korean Patent Application No. 10-2007-0056045, filed on Jun. 8, 2007, in the Korean Intellectual Property Office, the disclosure of which is incorporated herein in its entirety by reference.

FIELD OF THE INVENTION

The present invention relates to a method of manufacturing a semiconductor device, and more particularly, to a method of controlling the thickness of a gate insulating layer of a complementary metal-oxide-semiconductor (CMOS) device.

BACKGROUND

In general, in a complementary metal-oxide-semiconductor (CMOS) device, the gate leakage current is five times greater in an n-type metal-oxide-semiconductor (NMOS) region than in a p-type metal-oxide-semiconductor (PMOS) region, and the transistor channel current is two times greater in a NMOS region than in a PMOS region due to the difference in the mobility of charges and holes. Normally, in order to improve the transistor channel current in the PMOS region, which is recessive in terms of the transistor channel current, the width of the PMOS region is increased. However, this method has limitations with regards to the integration of the CMOS device.

Meanwhile, the transistor channel current in a PMOS region can be improved by forming a thinner gate insulating layer for a PMOS region than for an NMOS region. This method is advantageous because the gate leakage current of the PMOS region is lower than that of the NMOS region. However, modifying the thicknesses of the gate insulating layers of the PMOS region and the NMOS region MA may be complicated. That is, it can be difficult to first form gate insulating layers to the same thickness in the PMOS region and the NMOS region and then to modify the thickness of the gate insulating layers through a patterning process in which a predetermined region of the gate insulating layers is selectively exposed. This process has another disadvantage in that manufacturing costs of the semiconductor device increase.

SUMMARY

Embodiments according to the invention can provide methods of forming devices including different gate insulating layers on PMOS/NMOS regions. Pursuant to these embodiments, a method of forming a device can be provided by selectively injecting fluorine (F) into a first region on a substrate and avoiding injecting the fluorine (F) into a second region on the substrate. A first gate insulating layer is formed of oxynitride layers on the first and second regions to have first and second thicknesses, respectively, where the first thickness is less than the second thickness. A second gate insulating layer is formed on the first gate insulating layer and a gate electrode pattern is formed on the second gate insulating layer.

The forming of the first gate insulating layer may be performed in an atmosphere containing NO by applying a rapid thermal processing (RTP). The atmosphere containing NO may be replaced with an atmosphere containing $N_2O$ or an atmosphere containing $NH_3$ and $O_2$. The RTP may be performed at a temperature in the range of 800° C.-1200° C. The method may further comprise, prior to the injecting of fluorine (F) into the first region, forming a pad oxide layer on the first region and the second region. When a pad oxide layer is formed, the method may further comprise, prior to the forming of the first gate insulating layers, removing the pad oxide layer. The removing of the pad oxide layer may be performed using an HF solution. The injecting of fluorine (F) may be performed by using injecting ion beams, plasma doping, or cluster ion doping. The forming of the second gate insulating layer may comprise forming a high-k dielectric insulating layer containing Hf, wherein the high-k dielectric insulating layer containing Hf may comprise HfSiON, HfO or HfSiO. The forming of the second gate insulating layer may comprise forming a high-k dielectric insulating layer containing Zr or La. The forming of the second gate insulating layer may comprise silicon nitride (SiN), silicon oxide nitride (SiON), or silicon oxide ($SiO_2$). The forming of the gate electrode pattern may comprise forming a gate electrode containing titanium nitride formed using a physical vapor deposition method or a chemical vapor deposition method.

DESCRIPTION OF EMBODIMENTS ACCORDING TO THE INVENTION

Figure 1:
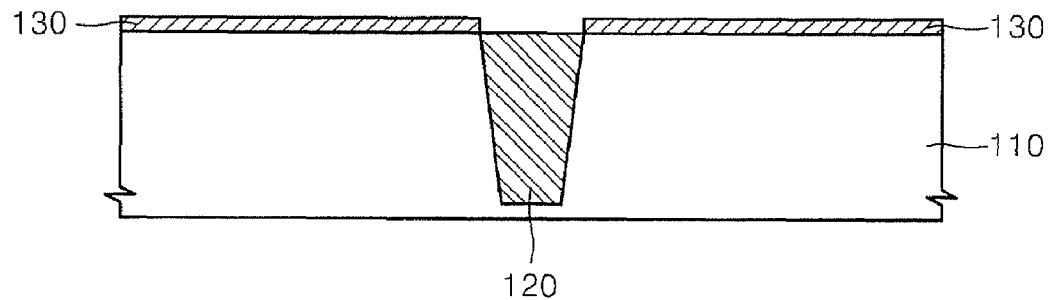
FIGS. 1 through 6 are cross-sectional views illustrating a method of manufacturing a semiconductor device according to an embodiment of the present invention.

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals denote like elements throughout the specification.

Throughout the specification, it will also be understood that when an element such as layer, region, or substrate is referred to as being "on" another element, it can be directly on the other element, or intervening elements may also be present. In addition, relative terms such as "lower" or "bottom," and "upper" or "top" may be used to describe relationship between elements as illustrated in the drawings. These relative terms can be understood to include different directions in addition to the described directions illustrated in the drawings. For example, when elements are turned over in the drawings, elements described to be on lower surfaces of other elements are formed on upper surfaces of the other elements. Therefore, the term "lower" depends only on a predetermined direction and can include both "upper" and "lower" directions. Similarly, when a device is turned over in one of the drawings, elements which are described to be "below or beneath" some elements will then be "above" the elements. Therefore, the term "below" can include both a direction of above and below.

It will be understood that when an element is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

FIGS. 1 through 6 are cross-sectional views illustrating a method of manufacturing a semiconductor device according to an embodiment of the present invention.

Referring to FIG. 1, a pad oxide layer 130 is formed on a semiconductor substrate 110. The semiconductor substrate 110 may be a silicon substrate. The pad oxide layer 130 can protect the semiconductor substrate 110 in subsequent processes, and may preferably have a thickness of about 10 nm.

Figure 2:
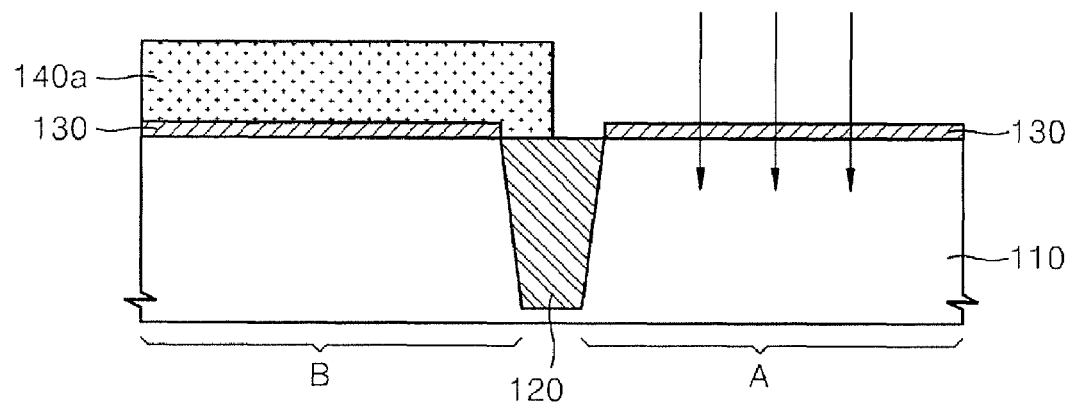

Referring to FIG. 2, the semiconductor substrate 110 can be defined to include a first region A and a second region B. In the current embodiment of the present invention, the first region A may be preferably a p-type metal-oxide-semiconductor (PMOS) region, and the second region B may be preferably an n-type metal-oxide-semiconductor (NMOS) region. The first region A and the second region B may be separated by an isolation layer 120. The pad oxide layer 130 is formed on the first region A and the second region B. First, a first mask layer pattern 140a exposing the first region A and covering the second region B is formed, and then a first channel ion injection process is performed on the first region A. If the first region A is a PMOS region, the first channel ion injection process includes process of injecting phosphorus (P) ions and/or arsenic (As) ions. Meanwhile, in the current embodiment of the present invention, while the first channel ion injection process is performed on the first region A, fluorine (F) is selectively injected.

In some embodiments according to the invention, fluorine (F) is selectively injected into the first region A means that fluorine (F) is injected only into the first region A while the injection of fluorine (F) into the second region B is avoided. The injection of fluorine (F) can be used to control the thickness of gate insulating layers in subsequent processes formed on the PMOS region. The fluorine (F) can be injected using an ion beam injection method, a plasma doping, method, or a cluster ion doping method. In particular, when fluorine (F) is injected using an ion beam injection method, its dose may be in the range of $10^{14}$ cm$^{-2}$-$10^{16}$ cm$^{-2}$, preferably about $10^{15}$ cm$^{-2}$. Also, when fluorine (F) is injected using an ion beam injection method, the acceleration energy may be in the range of 10-30 KeV, preferably about 20 KeV. Activation annealing can be performed after injecting fluorine (F).

Figure 3:
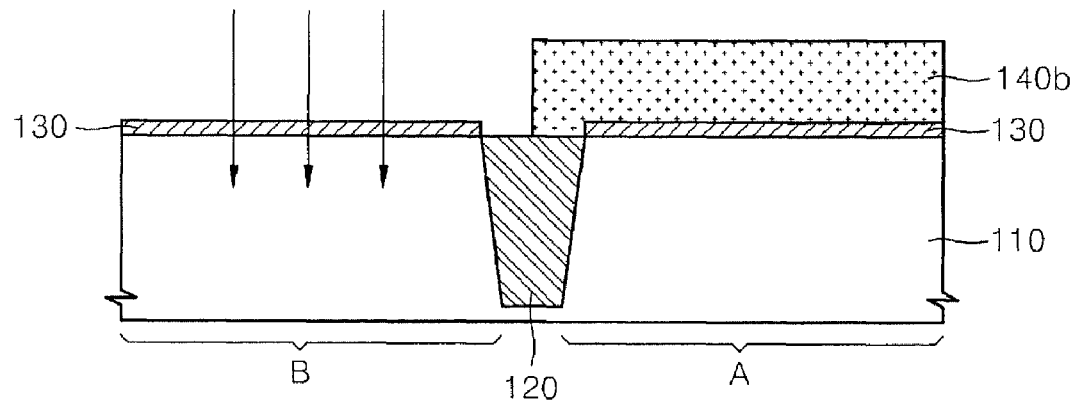

Referring to FIG. 3, a second mask layer pattern 140b exposing the second region B and covering the first region A is formed, and then a second channel ion injection process is performed on the second region B. If the second region B is an NMOS region, the second channel ion injection process includes injecting ions into the second region B. Meanwhile, in the current embodiment the first channel ion injection process is performed before the second channel ion injection process, but the present invention is not limited thereto, and the second channel ion injection process may be performed before the first channel ion injection process.

Figure 4:
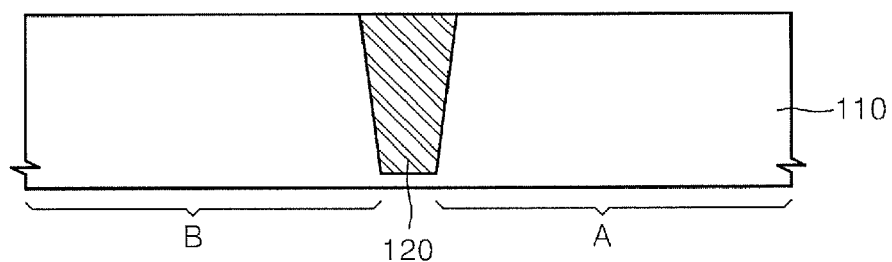

Referring to FIG. 4, the semiconductor substrate 110 is exposed by removing the pad oxide layer 130 formed on the first region A and the second region B. The pad oxide layer 130 may be preferably removed by wet-etching the pad oxide layer 130 using a Hf solution.

Figure 5:
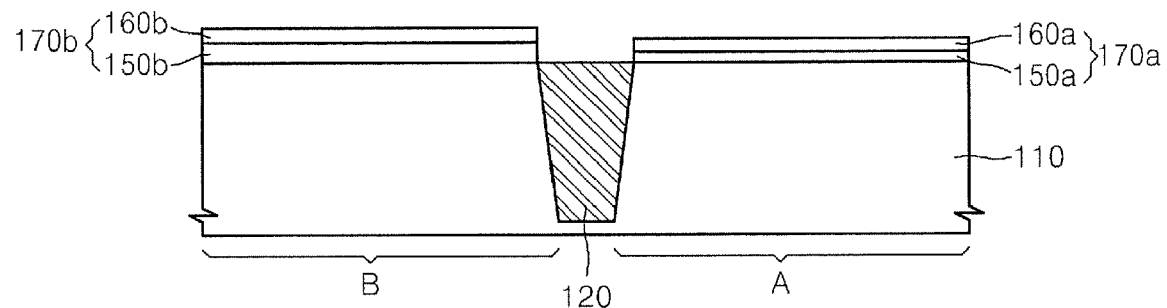

Referring to FIG. 5, first gate insulating layers 150a and 150b are respectively formed on the first region A and the second region B simultaneously. The first gate insulating layers 150a and 150b are formed of an oxynitride layer. The oxynitride layer is formed in an atmosphere containing NO using a rapid thermal processing (RTP) or a furnace process. In this case, the RTP may be preferably performed at a temperature in the range of 800° C.-1200° C. According to another embodiment of the present invention, the first gate insulating layers 150a and 150b which are formed of an oxynitride layer may be formed in an atmosphere containing $N_2O$ using an RTP or a furnace process. According to another embodiment of the present invention, the first gate insulating layers 150a and 150b which are formed of an oxynitride layer may be formed in an atmosphere containing $NH_3$ and $O_2$ using an RTP or a furnace process. The first gate insulating layer 150a formed on the first region A has a smaller thickness than the first gate insulating layer 150b formed on the second region B. This is because fluorine (F) is injected into the first region A, and in detail, because the growth of the oxynitride layer formed on the semiconductor substrate 110 is retarded by the fluorine (F). Thus, gate insulating layers which have different thicknesses according to predetermined regions of the semiconductor substrate 110 can be formed simultaneously.

Next, second gate insulating layers 160a and 160b are respectively formed on the first gate insulating layer 150a formed on the first region A and on the first gate insulating layer 150b formed on the second region B simultaneously or sequentially. The second gate insulating layer 160a formed on the first gate insulating layer 150a of the first region A and the second gate insulating layer 160b formed on the first gate insulating layer 150b of the second region B may have the same thickness. The second gate insulating layers 160a and 160b may be high-k dielectric insulating layers containing Hf, and the high-k dielectric insulating layers including Hf may preferably include HfSiON, HfO or HfSiO. Also, the second gate insulating layers 160a and 160b may be high-k dielectric insulating layers containing Zr or La. Alternatively, according to another embodiment of the present invention, the second gate insulating layers 160a and 160b may be formed of SiN, SiON or $SiO_2$. A gate insulating layer 170a formed on the first region A may be formed of the first gate insulating layer 150a and the second gate insulating layer 160a. A gate insulating layer 170b formed on the second region B may be formed of the first gate insulating layer 150b and the second gate insulating layer 160b.

Figure 6:
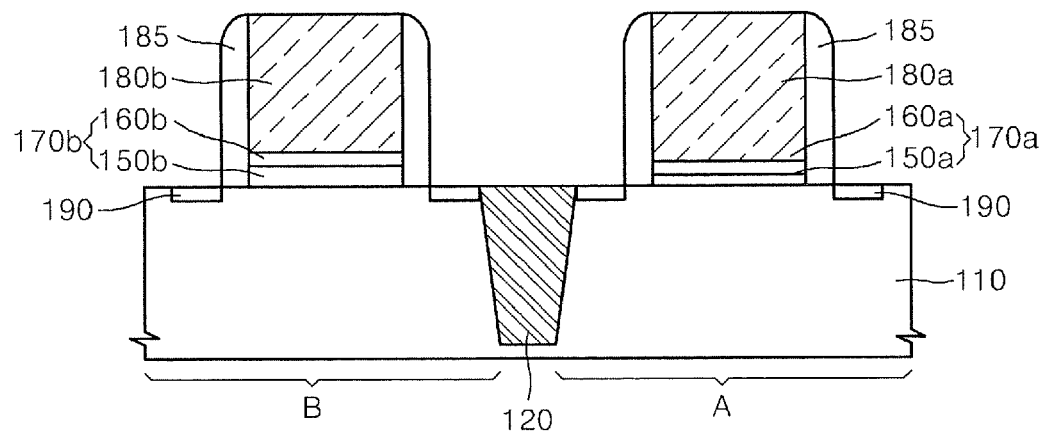

Referring to FIG. 6, gate electrode patterns 180a and 180b are respectively formed on the second gate insulating layers 160a and 160b of the first region A and the second region B. The gate electrode patterns 180a and 180b may be formed of at least one material selected from the group consisting of titanium, titanium nitride, tungsten, and polysilicon. The titanium nitride, in particular, may be formed using a physical vapor deposition method or a chemical vapor deposition method. Spacer patterns 185 are formed on lateral sides of the gate electrode patterns 180a and 180b. Then, source and drain regions 190 can be formed by performing ion injection process using the gate electrode patterns 180a and 180b and the spacer patterns 185 as a mask.

Figure 7:
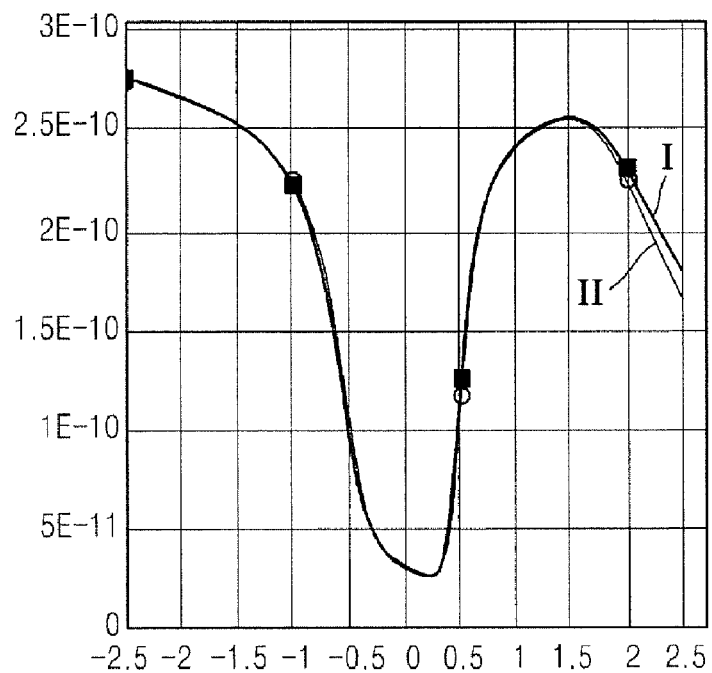
FIG. 7 is a graph showing a capacitance-voltage (C-V) characteristic in an NMOS region according to an embodiment of the present invention.
Figure 8:
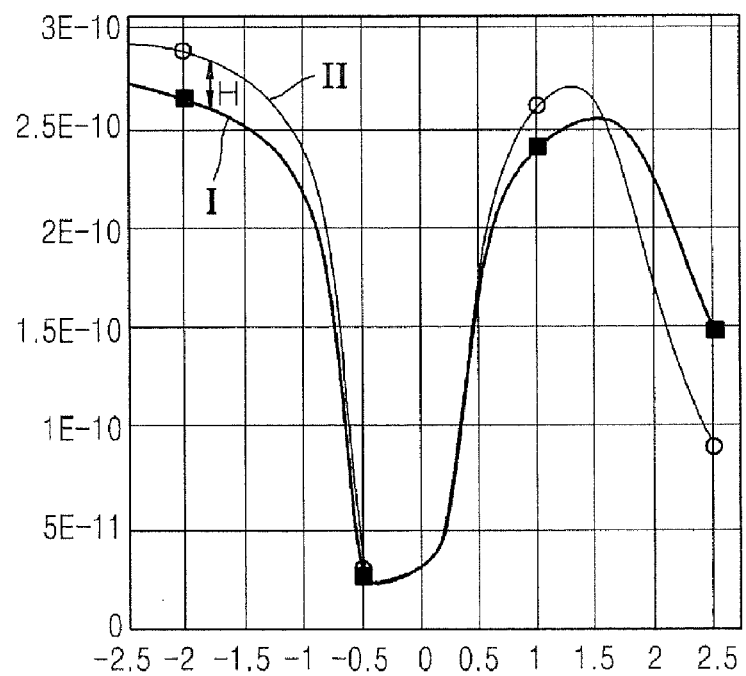
FIG. 8 is a graph showing a C-V characteristic in a PMOS region according to an embodiment of the present invention.

FIG. 7 is a graph showing a capacitance-voltage (C-V) characteristic in an NMOS region according to an embodiment of the present invention, and FIG. 8 is a graph showing a C-V characteristic in a PMOS region according to an embodiment of the present invention. In the graphs showing C-V characteristics, the horizontal axis denotes voltage, and the vertical axis denotes capacitance of the gate insulating layers.

Referring to FIGS. 7 and 8, after selectively injecting fluorine (F) only into the PMOS region, the C-V characteristics of the gate structure in which gate insulating layers according to the conventional art (I) are applied and the C-V characteristics of the gate structure in which the gate insulating layers according to the present invention (II) are applied are compared. The gate insulating layers according to the conventional art (I) include a first gate insulating layer formed of an oxide layer and a second gate insulating layer formed of a high-k dielectric insulating layer. The gate insulating layers according to the present invention (II) include a first gate insulating layer formed of an oxynitride layer and a second gate insulating layer formed of a high-k dielectric insulating layer. In the gate structure in which the gate insulating layer according to the conventional art (I) is applied, the capacitances of the NMOS region (FIG. 7) and the PMOS region (FIG. 8) are almost the same at an identical voltage. This result indicates that even when fluorine (F) is selectively injected into the PMOS region, if the first gate insulating layer is formed of an oxide layer, the thicknesses of the first gate insulating layers in the PMOS region and the NMOS region are almost the same. On the other hand, in the gate structure in which the gate insulating layer (II) according to an embodiment of the present invention is applied, the capacitance of the PMOS region (FIG. 8) is higher (H) than the capacitance of the NMOS region (FIG. 7) at an identical voltage. This result indicates that when fluorine (F) is selectively injected into the PMOS region and the first gate insulating layer is formed of an oxynitride layer, the thickness of the first gate insulating layer of the PMOS region is smaller than the thickness of the first gate insulating layer in the NMOS region.

Figure 9:
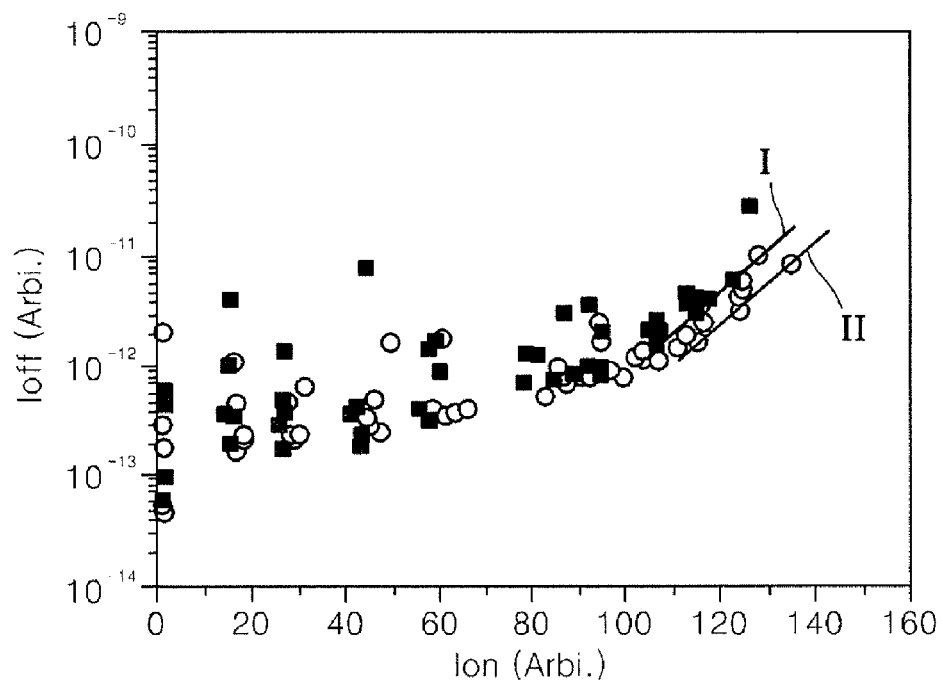
FIG. 9 is a graph showing an $I_{on}$-$I_{off}$ characteristic in a PMOS region of a semiconductor device manufactured according to an embodiment of the present invention.

FIG. 9 is a graph showing an $I_{on}$-$I_{off}$ characteristic in a PMOS region of a semiconductor device manufactured according to an embodiment of the present invention.

Referring to FIG. 9, after selectively injecting fluorine (F) only into the PMOS region, the $I_{on}$-$I_{off}$ characteristics of the gate structure in which gate insulating layers according to the conventional art (I) are applied and the $I_{on}$-$I_{off}$ characteristics of the gate structure in which the gate insulating layer according to the present invention (II) is applied are compared. The gate insulating layers according to the conventional art (I) include a first gate insulating layer formed of an oxide layer and a second gate insulating layer formed of a high-k dielectric insulating layer. The gate insulating layers according to the present invention (II) include a first gate insulating layer formed of an oxynitride layer and a second gate insulating layer formed of a high-k dielectric insulating layer. The values of $I_{on}$ with respect to the same values of $I_{off}$ are higher in the gate structure in which gate insulating layers according to the present invention (II) are applied than in the gate structure in which the gate insulating layers according to the conventional art (I) are applied. This result indicates that even when the thickness of the gate insulating layer of the PMOS region according to the present invention is reduced, the quality of the gate insulating layers is good.

Figure 10:
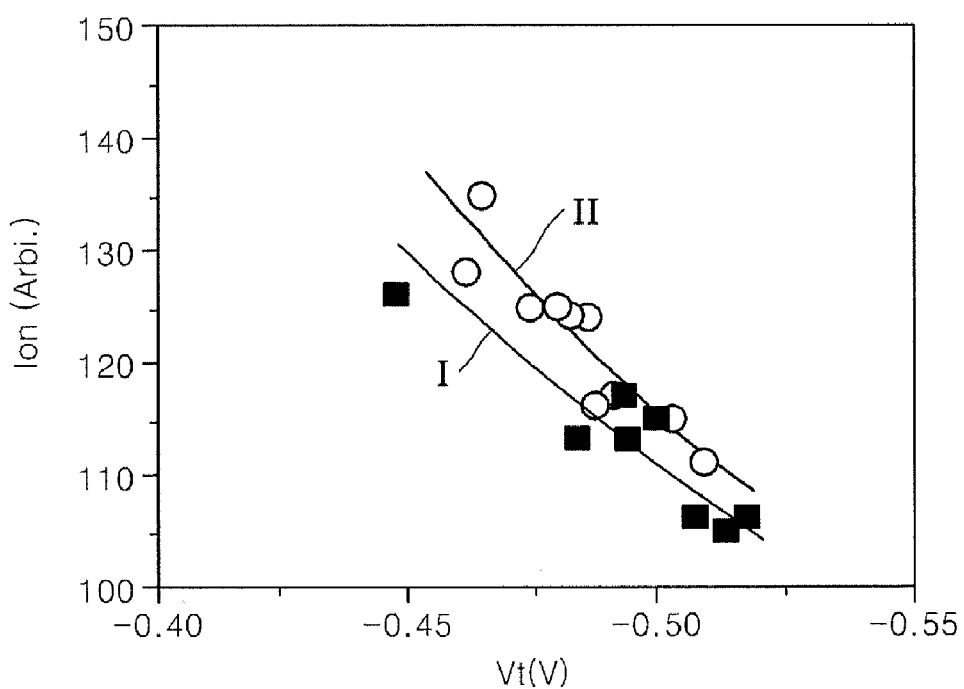
FIG. 10 is a graph showing a $V_t$-$I_{on}$ characteristic in a PMOS region of a semiconductor device manufactured according to an embodiment of the present invention.

FIG. 10 is a graph showing a $V_t$-$I_{on}$ characteristic in a PMOS region of a semiconductor device manufactured according to an embodiment of the present invention.

Referring to FIG. 10, after selectively injecting fluorine (F) only into the PMOS region, the $V_t$-$I_{on}$ characteristics of the gate structure in which gate insulating layers according to the conventional art (I) are applied and $V_t$-$I_{on}$ characteristics of the gate structure in which the gate insulating layers according to the present invention (II) are applied are compared. The gate insulating layers according to the conventional art (I) include a first gate insulating layer formed of an oxide layer and a second gate insulating layer formed of a high-k dielectric insulating layer. The gate insulating layers according to the present invention (II) include a first gate insulating layer formed of an oxynitride layer and a second gate insulating layer formed of a high-k dielectric insulating layer. The values of $I_{on}$ with respect to the same values of $V_t$ are higher in the gate structure in which gate insulating layers according to the present invention (II) are applied than in the gate structure in which the gate insulating layers according to the conventional art (I) are applied. This result indicates that even when the thickness of the gate insulating layer of the PMOS region according to the present invention is reduced, the quality of the gate insulating layers is good.

Figure 11:
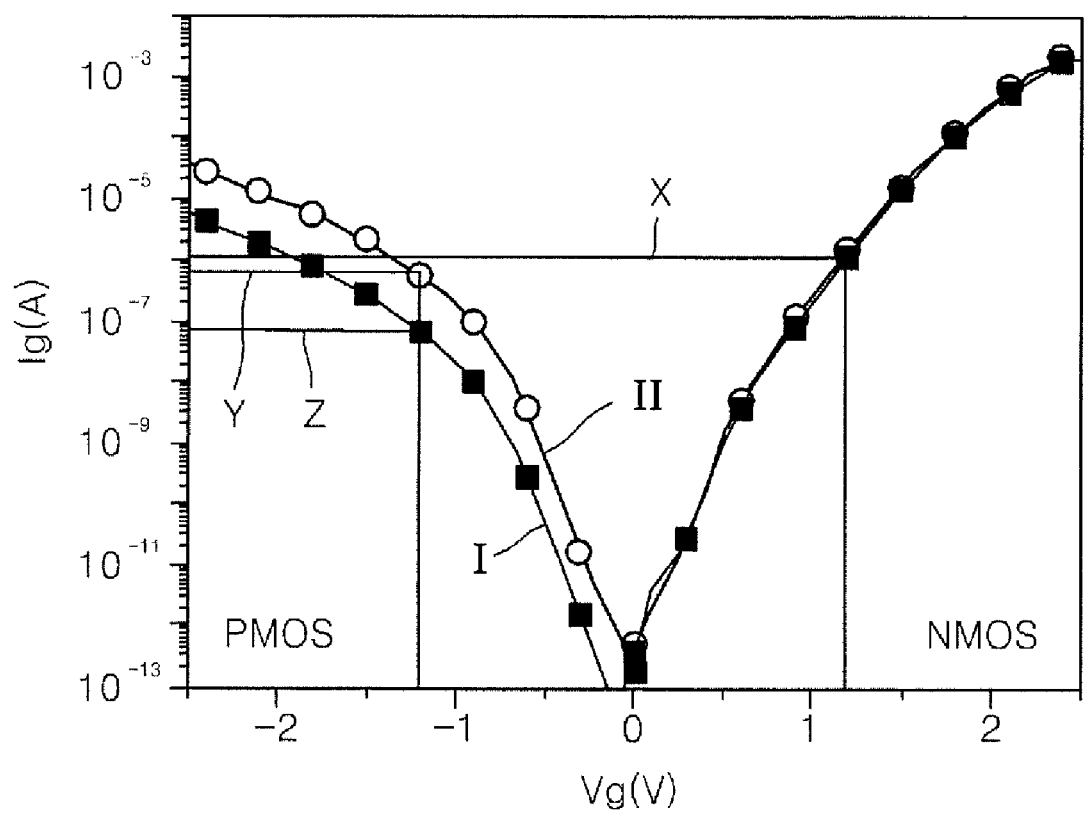
FIG. 11 is a graph showing a leakage current characteristic of a semiconductor device manufactured according to an embodiment of the present invention.

FIG. 11 is a graph showing a leakage current characteristic of a semiconductor device manufactured according to an embodiment of the present invention.

Referring to FIG. 11, after selectively injecting fluorine (F) only into the PMOS region, the leakage current characteristics of the gate structure in which gate insulating layers according to the conventional art (I) are applied and of the gate structure in which the gate insulating layers according to the present invention (II) are applied are compared. The gate insulating layers according to the conventional art (I) include a first gate insulating layer formed of an oxide layer and a second gate insulating layer formed of a high-k dielectric insulating layer. The gate insulating layers according to the present invention (II) include a first gate insulating layer formed of an oxynitride layer and a second gate insulating layer formed of a high-k dielectric insulating layer.

The leakage current Y in the PMOS region in the gate structure in which gate insulating layers according to the present invention (II) are applied is higher than the leakage current Z in the PMOS region in the gate structure in which the gate insulating layers according to the conventional art (I) are applied. It is assumed that this occurs because the gate insulating layers in the PMOS region according to the present invention are thinner than the gate insulating layer according to the conventional art (I). However, in the gate structure in which the gate insulating layers according to the present invention (II) are applied, the leakage current Y of the PMOS region is lower by about half than the leakage current X of the NMOS region. Accordingly, the leakage current of the PMOS region is substantially appropriate even when the gate insulating layers according to an embodiment of the present invention (II) are applied.

According to the method of manufacturing a semiconductor device according to the present invention, the gate insulating layers can be formed thinner in the PMOS region than in the NMOS region using simple processes at low cost and good electric characteristics of the semiconductor device can be secured at the same time.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed:

1. A method of forming a semiconductor device, the method comprising:
    selectively injecting fluorine (F) into a first region on a substrate and avoiding injecting the fluorine (F) into a second region on the substrate;
    simultaneously forming a first gate insulating layer comprising oxynitride layers having a first thickness and a second thickness on the first region and the second region, respectively, wherein the first thickness is less than the second thickness;
    forming a second gate insulating layer on the first gate insulating layer; and
    forming a gate electrode pattern on the second gate insulating layer.

2. The method of claim 1, wherein the first region comprises a PMOS region and the second region comprises an NMOS region.

3. The method of claim 1, wherein simultaneously forming a first gate insulating layer comprises forming the first gate insulating layer in an atmosphere including NO.

4. The method of claim 1, wherein simultaneously forming a first gate insulating layer comprises forming the first gate insulating layer in an atmosphere including $N_2O$.

5. The method of claim 1, wherein simultaneously forming a first gate insulating layer comprises forming the first gate insulating layer in an atmosphere including $NH_3$ and $O_2$.

6. The method of claim 1, wherein simultaneously forming a first gate insulating layer comprises applying a rapid thermal process (RTP).

7. The method of claim 6, wherein the RTP is performed at a temperature in the range of about 800° C. to about 1200° C.

8. The method of claim 1, further comprising, prior to selectively injecting fluorine (F) into the first region:
    forming a pad oxide layer on the first region and the second region.

9. The method of claim 8, further comprising prior to simultaneously forming a first gate insulating layers:
    removing the pad oxide layer.

10. The method of claim 9, wherein removing the pad oxide layer comprises removing the pad oxide layer using an HF solution.

11. The method of claim 1, wherein selectively injecting fluorine (F) comprises selectively injecting the fluorine (F) by injecting ion beams.

12. The method of claim 1, wherein selectively injecting fluorine (F) comprises selectively injecting the fluorine (F) using plasma doping.

13. The method of claim 1, wherein selectively injecting fluorine (F) comprises selectively injecting the fluorine (F) using cluster ion doping.

14. The method of claim 1, wherein selectively injecting fluorine (F) further comprises performing activation annealing after the selectively injecting the fluorine (F).

15. The method of claim 1, wherein forming a second gate insulating layer comprises forming a high-k dielectric insulating layer including Hf.

16. The method of claim 15, wherein the high-k dielectric insulating layer containing Hf comprises HfSiON, HfO or HfSiO.

17. The method of claim 1, wherein forming a second gate insulating layer comprises forming a high-k dielectric insulating layer including Zr or La.

18. The method of claim 1, wherein forming a second gate insulating layer comprises forming an insulating layer including silicon nitride (SiN), silicon oxide nitride (SiON), or silicon oxide ($SiO_2$).

19. The method of claim 1, wherein forming a gate electrode pattern comprises forming a gate electrode including polysilicon or titanium nitride.

20. The method of claim 19, wherein forming a gate electrode including titanium nitride comprises forming the gate electrode using a physical vapor deposition method or a chemical vapor deposition process.

* * * * *